BROADBAND AMPLIFIER WITH SEMICONDUCTOR INTERSTAGE ELEMENT

Filed Oct. 25, 1967 3 Sheets-Sheet 1

INVENTORS
JOHN A. ARCHER
JAMES F. GIBBONS
GOPAL M. PURNAIYA
BY Gordon H. Telfer
ATTORNEY INVENTORS
JOHN A. ARCHER
JAMES F. GIBBONS
GOPAL M. PURNAIYA
BY Gordon H. Telfer
ATTORNEY INVENTORS
JOHN A. ARCHER
JAMES F. GIBBONS
GOPAL M. PURNAIYA
BY Gordon H Telfer
ATTORNEY United States Patent Office 3,483,477

Patented Dec. 9, 1969

3,483,477

BROADBAND AMPLIFIER WITH SEMICONDUCTOR INTERSTAGE ELEMENT

Gopal M. Purnaiya, Stanford, John A. Archer, Los Altos, and James F. Gibbons, Palo Alto, Calif., assignors to Fairchild Camera and Instrument Corporation, Syosset, N.Y., a corporation of Delaware Filed Oct. 25, 1967, Ser. No. 678,006

Int. Cl. H03f *3/04*

U.S. Cl. 330—31 5 Claims

ABSTRACT OF THE DISCLOSURE

A transistor interstage element is provided which permits the construction of broadband amplifiers at UHF and microwave frequencies that are suitable for integrated circuitry. A simulated inductance is exhibited between two of the terminals of a conventional transistor when connected by its emitter to a noncommon terminal of an amplifier stage. Such an interstage element used as a two terminal element (emitter-collecter terminals with the base connected to the collector with appropriate loading) exhibits frequency independent admittance transforms of the base impedance at the emitter including $L=R/2\pi f_t$. Normal transistors operated under noncritical bias conditions may be used as the interstage element.

BACKGROUND OF THE INVENTION

Field of the invention

This invention relates to broadband amplifiers operable at microwave frequencies and more particularly to a semiconductor interstage element compatible with monolithic construction techniques providing a simulated interstage inductance which permits microwave broadbanding.

Description of the prior art

Great difficulty has been encountered in providing micro-electronic, solid state, multistage amplifiers capable of a bandpass of at least one octave at frequencies up into the microwave region. For broadband amplifiers operable up to 500 mHz., a few inductorless monolithic circuits have been realized. For amplifiers operable at frequencies up to the lower microwave region, there has been no means for simulating an inductive interstage characteristic permitting satisfactory broadband-pass amplifiers compatible with monolithic fabrication.

There are no manufacturing techniques available for fabricating discrete coils of a size compatible with state of the art microcircuitry. In some applications, hybrid integrated circuits comprising a cascade of discrete devices utilizing discrete or film inductors have been found to obtain satisfactory gain characteristics over relatively broad bands at microwave frequencies. However, particularly at frequencies in excess of 100 megacycles, such circuitry is also found to produce undersirable parasitic stray effects. Furthermore, a hybrid circuit does not provide reliability comparable with monolithic construction techniques. The dimensions of useful inductors are still large compared with those of state of the art devices.

Thus, there has been little point in utilizing monolithic structures in such amplifiers.

There have been some attempts to build monolithic inductorless broadband amplifiers operable at extremely high frequencies. Such constructions have relied on negative feedback from succeeding stages as an alternative to tuning with inductors. A major disadvantage of this method is that a broadband-pass characteristic presently is obtained only within a frequency range up to approximately 500 mHz. Further, reliance on negative feedback characteristics makes difficult successive monolithic cascading, thereby limiting the overall gain attainable. An additional disadvantage of the monolithic negative feedback construction is the practical difficulty in device "tuning" necessary to achieve the desired band-pass characteristics.

It has been known for some time that a transistor may be connected to provide an inductive effect. However, the previous literature on this topic has been concerned with either (a) special operating conditions or (b) special transistor fabrication techniques that would ensure a high Q inductive effect.

An example within category (a) are the papers by H. G. Dill ("Semiconductor Inductive Elements" in Semiconductor Products, April 1962, pp. 30–33 and May 1962, pp. 28-31) which discuss band-pass amplifiers using inductive transistor interstage elements up to 200 kHz. with Q of up to 50 achieved by avalanche multiplication. This procedure has not proven to be practical, however, due to the critical bias condition required to achieve a given Q and extreme variability of avalanche multiplication among transistors. A further problem with this mode of operation is that avalanche multiplication is typically a noisy process and the noise figure of the resulting amplifier is so large as to make it highly unsuitable for early stages in an amplifier where the signal is weak.

An alternate approach to the problem of achieving a high Q inductive effect (type (b) mentioned above) was discussed by Fischer and Jindal in Proceedings of the Fifth Annual Microelectronics Symposium, July 1966. This alternate solution relies on special fabrication techniques and transistor geometries that will produce a so-called retrograded base in the transistors that are to be used to achieve the simulated inductance. Fischer and Jindal showed that high Q inductance could indeed be obtained is this way, though the fabrication techniques are sufficiently difficult that this approach has also proven to be impractical, particularly for monolithic amplifiers.

SUMMARY OF THE INVENTION

To provide a circuit inductance compatible with monolithic construction of broadband amplifiers operable at UHF and microwave frequencies (at least 100 mHz.) and to overcome the shortcomings of prior art circuitry, new circuits employing a semiconductor interstage element simulating inductance have been invented.

In the present invention a technique is employed by which standard transistors, manufactured by any of the presently used techniques such as planar double diffusion, and operated under uncritical bias conditions, can be used to achieve an inductive effect with a Q that is low (about 3) but adequate for a wide range of amplifier designs, including broadband amplifiers into the microwave frequency range. Since neither the bias condition nor the transistor fabrication method are critical to the use of the present invention, it can, unlike the prior art, be readily applied to the design of monolithic amplifiers.

An amplifier circuit in accordance with the present invention may use a semiconductor interstage means for providing a simulated inductance comprising a semiconductor body having an emitter, a base and a collector; the emitter and the collector comprising an input terminal pair; the base and the collector comprising an output terminal pair; wherein the base is resistively coupled to the collector. The interstage element is operated at bias levels below avalanche breakdown coupled to an amplifier stage or within a chain of more than one amplifier stage. The above described manner of transistor connection may be referred to as an inverted common collector connection (ICC). The fact that the ICC exhibits a large power loss means that it is not particularly useful as a signal transmission device. However, when used as a two terminal element with the base appropriately loaded, the transform admittance of the base impedance ladder at the emitter with the collector used as a common terminal is now recognized to provide frequency independent inductance. The transform is precisely equivalent only if the collector is used as a common connection. However, in some applications it may be suitable to permit the collector to drive into a high admittance load. The present invention, together with the advantages thereof, will be better understood by reference to the following detailed description and the accompanying drawing.

BRIEF DESCRIPTION OF THE DRAWING

FIGURE 3A is a series of performance curves for a single stage of amplification with an interstage element in accordance with this invention wherein FIGURE 3B is a circuit schematic;

FIGURE 4A is a performance curve for a single stage of amplification without the interstage element, wherein FIGURE 4B is a circuit schematic;

DESCRIPTION OF THE PREFERRED EMBODIMENTS

Figure 1A:
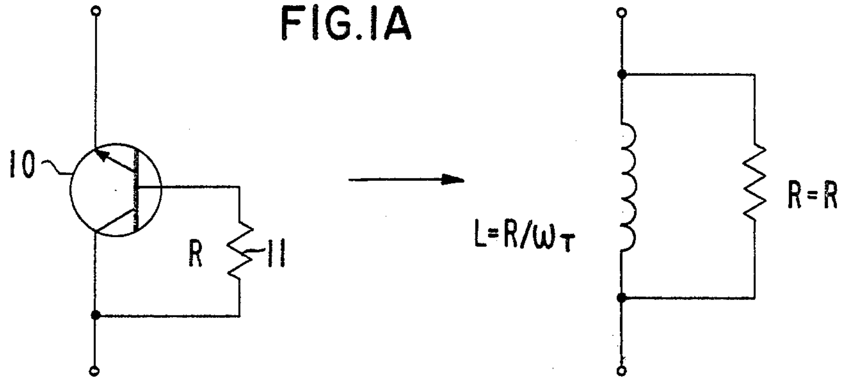
FIGURES 1A, 1B, and 1C are schematics of alternative interstage elements useful in circuits in accordance with this invention.

Referring to FIGURE 1A there is shown a basic circuit configuration of the interstage transistor 10 which is used in the present invention. The circuit configuration is essentially an inverted common collector connection (ICC) wherein the input terminals are the emitter-collector terminal pair and the output terminals are the base-collector terminal pair. Resistive loading of the base is effected with the base loading resistor 11 so that, in effect, the base output terminal is not utilized externally and the device is utilized in a two terminal mode. With such a connection, the transistor 10 has an inductive admittance equivalent to that shown in the right hand portion of the figure (an idealized transistor without internal resistance is assumed). The biasing components necessary to provide a reverse bias for the collector-base junction and forward bias for the emitter-base junction are not shown as they are well known in the art. The bias means is such as to provide D.C. potentials forward biasing the emitter-base junction and reverse biasing the base-collector junction but only below the level at which avalanche breakdown occurs in order to achieve broad bandpass. While the transistor 10 is shown as an NPN transistor, it may be a PNP transistor or similar solid state device.

Figure 1B:
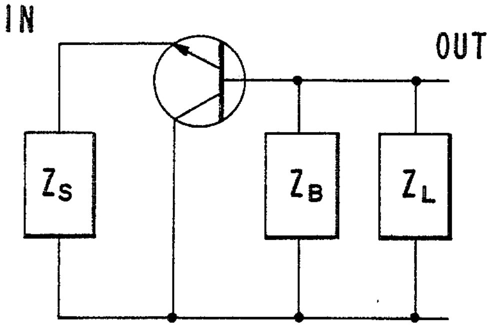
Figure 1C:
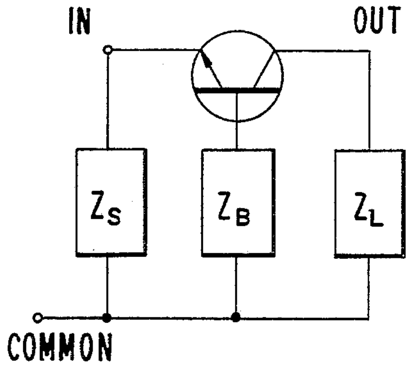

The particular configuration illustrated in FIGURE 1A may be varied. For example, a true inverted common collector connection in the three terminal mode may be employed with the output signal derived from the base (FIGURE 1B). Such a connection is not preferred because of relatively large power loss. A two terminal pair configuration as shown in FIGURE 1C is also suitable where employed with a low impedance load although it does not provide an exact equivalent inductance. In FIGURES 1B and 1C, $z_s$ and $z_L$ are, respectively, source and load impedances, and $z_B$ is a suitable base load. The ensuing description contemplates the use of an interstage element as shown in FIGURE 1A.

Figure 2:
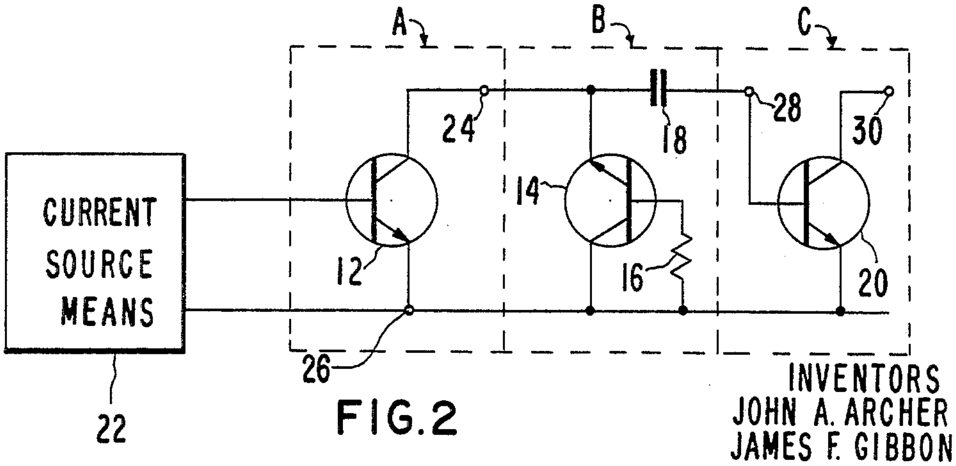
FIGURE 2 is a schematic of one embodiment of the present invention.

Referring now to FIGURE 2 there is shown an illustrative, simplified basic amplifier configuration utilizing an interstage element in accordance with this invention. The basic amplifier generally comprises a first amplification stage (A), consisting of a transistor 12; an interstage circuit (B) consisting of an interstage transistor 14, a base loading resistor 16, and a coupling capacitor 18; and, a second amplification stage (C) consisting of the transistor 20. The interstage transistor 14 and resistor 16 comprise the inductive interstage element.

It will be understood that additional amplification stages as well as inductive interstages may either precede or follow the two stages depicted; the only limitation being the degree of total signal gain desired. The iteration capability is one advantage of the invention.

The first stage transistor 12 has its base and emitter connected to the current source means 22. The current source means may be a preceding amplification stage or other external signal source means. The signal source may supply a high frequency signal in the UHF or microwave range (e.g. above 100 mHz.). The collector-output of transistor 12 is connected to the first stage output terminal 24. The emitter of the transistor 12 is connected to the common terminal 26.

The first stage (A) is coupled across the second amplifier stage input terminal 28 and the common terminal 26 by the interstage circuit (B). The first stage output terminal 24 is connected to the second stage input terminal 28 across the coupling capacitor 18. The emitter of the interstage transistor 14 is substantially non-resistively connected to the output terminal 24. The collector of transistor 14, as well as the emitter of the second stage transistor 20, are commonly connected to the common terminal 26. The resistor 16 serves to resistively load the base of the transistor 14 with respect to its collector. The second stage collector-output terminal 30 may be connected to an additional amplification stage or other loads as desired. D.C. bias elements are omitted from FIGURE 2.

Typically, the transistors 12, 14 and 20 are identical, there being no necessity of distinction for satisfactory broadband amplification. The transistors may be discrete or integrated in a monolithic semiconductor structure by well known techniques. The only transistor parameters of particular significance in an amplifier of the frequency range of $0.2\ f_t<f<f_t$ are the current gain bandwidth product $f_t$ and the base spreading resistance $r_b'$. The control of these parameters, the value of the coupling capacitance, and the value of the base loading resistor, substantially control the performance of the amplifiers.

Since the present invention imposes no special requirements on the transistor used as the interstage inductive element, it is preferred that readily available commercial devices be used including either mesa or planar double diffused devices having base regions with normal impurity concentration gradients, i.e., decreasing in impurity concentration from the emitter to the collector (an aiding field).

In the circuit as described, the interstage transistor 14 and base loading resistor 16 cooperate to exhibit an inductive coupling impedance across the first stage output terminal pair 24 and 26 and across the second stage input terminal pair 28 and 26. Thus a suitable inductive coupling is provided by employing only elements compatible with monolithic integrated circuit technology. Siimlar circuits employing inductive interstage elements as shown in FIGURES 1B and 1C may also be employed.

A brief analysis of the ICC circuit provides an additional understanding of the present invention. Generally speaking, the advantages of the ICC configuration rest in its input impedance transformation properties in the frequency range of interest. As a general principle, it may be said, insofar as is relevant to the desired effect of the present invention, that the ICC input impedance is a function of the sum of its emitter impedance and the ICC transformed base load impedance; the latter including the transferred elements of a simple resistance (base load resistor), capacitance (parasitic collector capacitance) and an equivalent inductance. For a practical consideration of the present invention in the frequency range of interest, the exhibited inductive effect is primarily dependent on the ICC transformation of the base load impedance—the emitter impedance being of negligible moment. It has been found that where, as herein illustrated, the base-collector circuit is comprised only of resistive and capacitive elements, the ICC configuration produces a simulated inductive effect derived predominantly from a circuit transformation of the resistive element of the base load impedance. In essence, the ICC connection described transforms the resistive element of the base load impedance into a simulated equivalent circuit of a parallel resistance and a frequency independent inductance; the latter being the source of the inductive effect of the present invention. In the frequency range of interest, while the inductive effect that is provided will normally produce a Q on the order of 3.0 or less, it remains substantially constant over the selected frequency band. This characteristic makes the present invention particularly suitable where amplification is sought over band widths of one octave or more. It has been found that such broad band amplification is obtainable with signal frequencies ranging from 30 mHz. to the microwave regions (e.g. 3 gHz.).

In the frequency range of interest (e.g. 0.1–3 gHz.), a monolithic structure has the advantage that parasitic elements due to packages and interconnections are eliminated or greatly reduced. The dimensions of the monolithic circuit are small compared with those of other state of the art devices. The invented interstage element permits the construction of cascaded monolithic broadband amplifiers, operable at frequencies up into the microwave region, having very desirable gain characteristics by straightforward integration techniques that may, for example, include the simultaneous fabrication of amplifier transistors and interstage transistors by selective double diffusion.

Figures 4A, 4B:
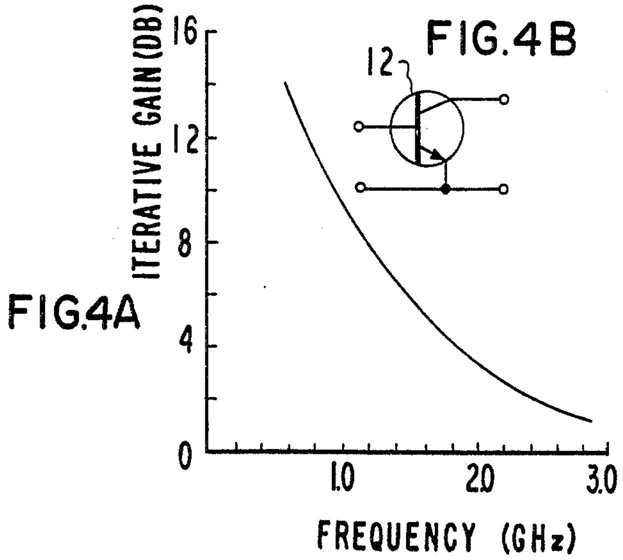
Figure 5:
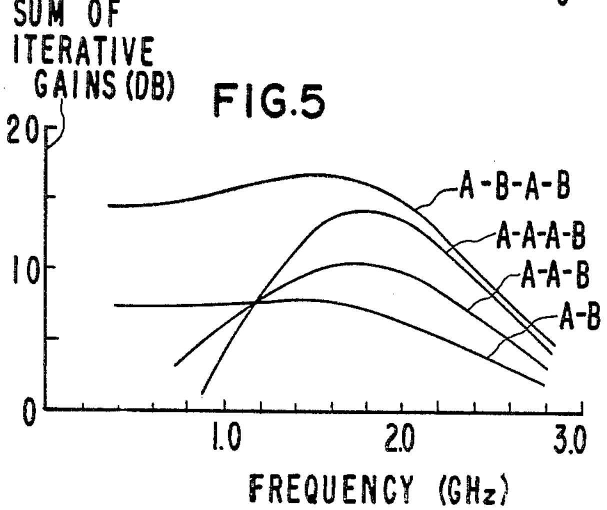
FIGURE 5 is a series of performance curves for illustrative multistage amplifiers; and, FIGURES 6 and 7 are, respectively, a schematic diagram and a performance curve for a particular amplifier embodying the present invention.

Referring now to FIGURES 3–5, the response of various amplifiers is shown by way of illustration. Iterative current gain has been chosen to characterize the performance of the individual stages of the illustrative amplifiers. Iterative gain as it is used herein is the gain per stage of an amplifier consisting of an infinite number of identical stages, or, alternatively, of a finite number of identical stages loaded with an impedance equal to the iterative input impedance and driven by a source having an impedance equal to the iterative output impedance.

Figures 3A, 3B:
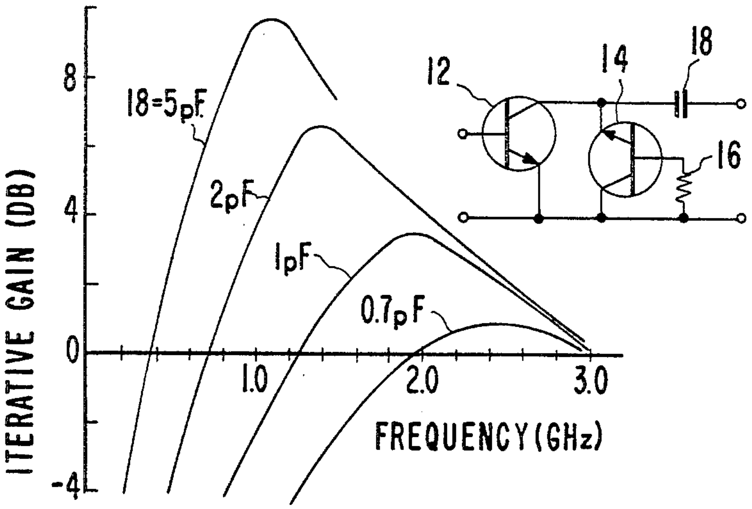

The calculated iterative gain of an illustrative amplification stage consisting of the widely used common emitter transistor amplifier stage with the ICC connected as an interstage element (shown in FIGURE 3B and hereinafter referred to as a type A stage) is shown in FIGURE 3A, as a function of frequency, for a particular value of base load resistance 16 (100 ohms) and for various values of coupling capacitors 18. The different curves are for the indicated values of capacitance. By way of comparison, the calculated iterative gain of the common emitter device alone (shown in FIGURE 4B and hereinafter referred to as a type B stage) is shown as a function of frequency in FIGURE 4A. By comparing FIGURES 3 and 4, it can be seen that the ICC interstage circuit makes it possible to employ the common emitter device as a microwave broadband amplifier.

The demonstrated overall response of illustrative multistage amplifiers is graphically depicted in FIGURE 5 wherein is shown the sum of the calculated iterative gains for various illustrative combinations of type A and type B stages. From this figure it can be seen that additional gain may be readily obtained by adding stages. It is preferable in many applications that the type B stages precede those of type A for reduced noise in the ultimate output signal.

The transistors employed in the A and B stages used to secure the curves of FIGURES 3–5 have a frequency cutoff $f_t$=3.3 gHz. and $r_b'$ of 20 ohms. The curves of FIGURE 5 are those for the case in which the capacitor 18 of each A stage is 1 picofarad. The elemental circuits of FIGURES 3B and 4B omit required D.C. bias elements that may be provided in accordance with known transistor biasing techniques.

Figure 6:
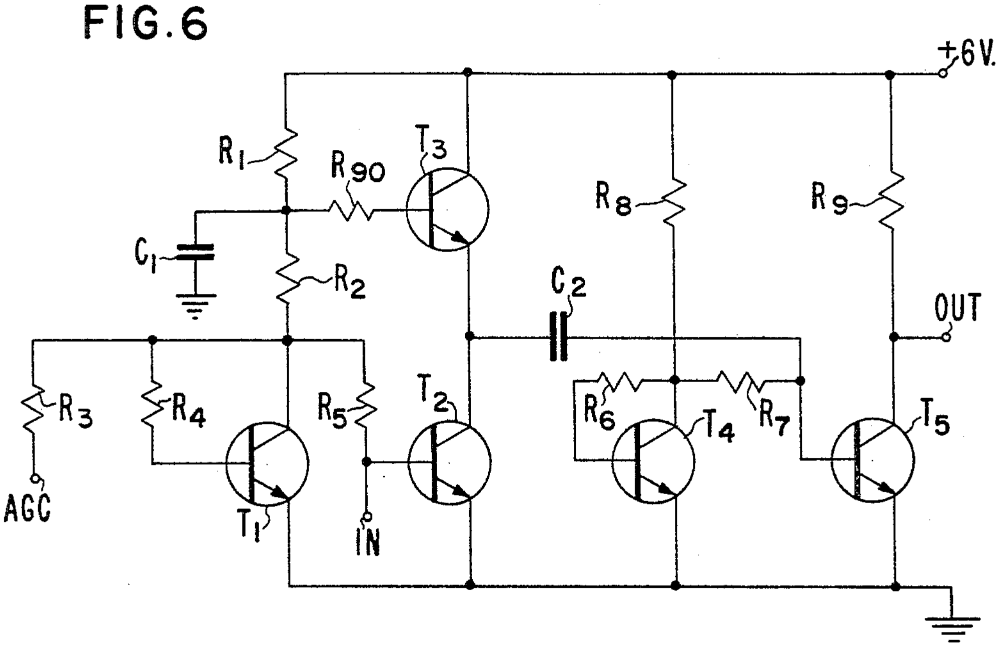

By way of further example, FIGURE 6 shows the schematic of a complete microwave bandpass amplifier that has been made in accordance with known semiconductor integrated circuit fabrication techniques employing planar double diffusion and successfully operated. In relation to the previous description in connection with FIGURES 3–5, the amplifier of FIGURE 6 includes a type A stage followed by a type B stage. Transistors T2 and T3 are the transistor elements of the A stage. Transistor T5 is the B stage while T1 and T4 set the bias level. The particular components in one tested example were:

| | |
|---|---|
| T1, T2, T3, T4 and T5 | $f_T \cong 2$ gHz. $r_b'$=20 ohms. |
| C1 | 20 picofarads. |
| C2 | 2 picofarads. |
| R1, R2, R3, R4, R5, R6, R7, R9 | 1000 ohms. |
| R8 | 2000 ohms. |
| R10 | 100 ohms. |

Figure 7:
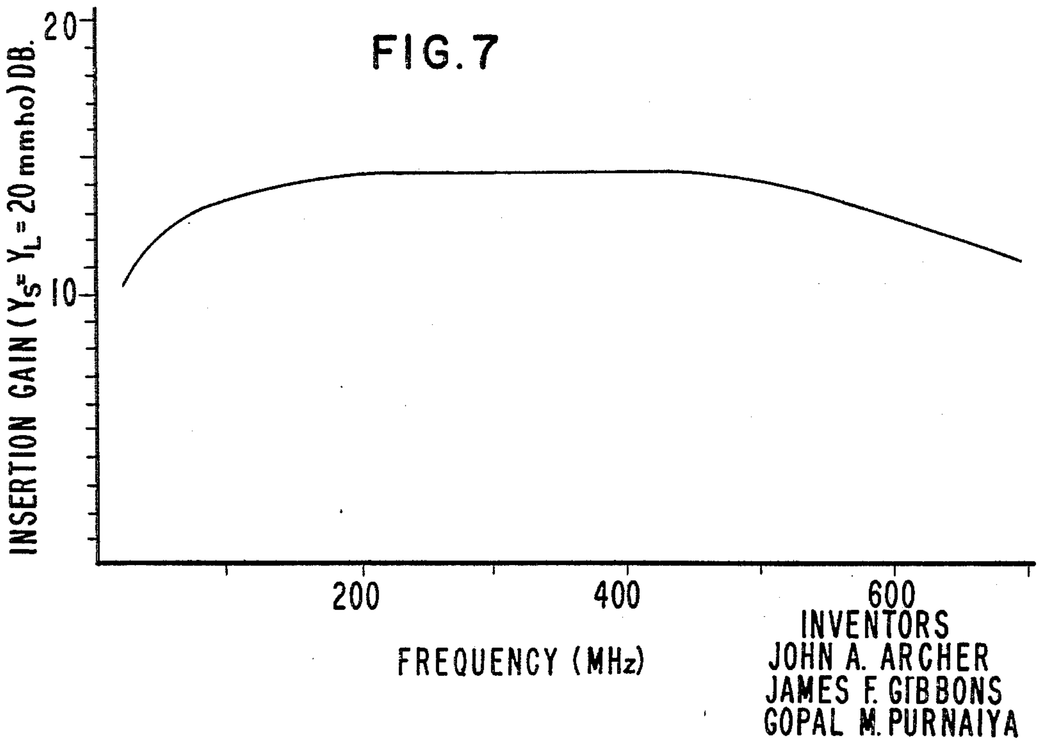

Typical performance is illustrated by the curve of FIGURE 7 illustrating 10–14 db insertion gain over a passband of 30 to 700 mHz.

It is important to integrated circuit fabrication that all of the transistors may be identical as to polarity and have corresponding regions of the same depth, resistivity, and impurity concentration gradient as is the case when they are formed by the same diffusion and other processing operations well known to the integrated circuit art.

While the above detailed description has shown the fundamental features of the invention as applied to a limited number of preferred embodiments, it will be understood that variations and substitutions and changes in form may be made by those skilled in the art without departing from the spirit and scope of the invention.

What is claimed is:

1. A broadband amplifier for operation at microwave frequencies containing *n* amplification stages, where *n* is a selected integer, each of said *n* amplification stages, containing an input, an output and a common lead, each of said *n* amplification stages except the last having an inductive semiconductor element connected across its output and common leads, said inductive semiconductor element comprising
   - a transistor containing a base lead, an emitter lead and a collector lead, said emitter lead being connected to the output lead from the preceding amplification stage, and said collector lead being connected to the common lead from said preceding amplification stage, and
   - resistive means coupling said base lead to said collector lead.

2. Structure as in claim 1 including circuit means for coupling the output lead of the $i$th amplification stage to the input lead of the $(i+1)$th amplification stage, where $i$ is an integer given by $1 \leq i < n$.

3. The structure of claim 2 wherein said $n$ amplification stages, said semiconductor inductive interstage elements and said circuit means for coupling comprises elements of a semiconductor integrated circuit.

4. The structure of claim 2 wherein:

said circuit means for coupling comprises a capacitor.

5. Structure as in claim 4 wherein $n$ equals two and therefore $i$ equals unity.

References Cited

UNITED STATES PATENTS

| | | | |
|---|---|---|---|
| 3,119,075 | 1/1964 | Dill | 330—31 |
| 3,152,309 | 10/1964 | Bogusz et al. | 333—80 |
| 3,160,835 | 12/1964 | Christensen | 333—80 |
| 3,343,003 | 9/1967 | Arseneau | 333—80 |
| 3,382,446 | 5/1968 | Carre | 330—31 |
| 3,408,600 | 10/1968 | Jordan | 333—80 |

JOHN KOMINSKI, Primary Examiner

U.S. Cl. X.R.

330—38; 333—80